(12) United States Patent
Hiramatsu et al.

(10) Patent No.: US 8,907,558 B2
(45) Date of Patent: Dec. 9, 2014

(54) WHITE LIGHT EMITTING DEVICE WITH RED AND GREEN-YELLOW PHOSPHOR

(71) Applicants: Ryosuke Hiramatsu, Kanagawa (JP); Kunio Ishida, Tokyo (JP)

(72) Inventors: Ryosuke Hiramatsu, Kanagawa (JP); Kunio Ishida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/644,440

(22) Filed: Oct. 4, 2012

(65) Prior Publication Data

US 2013/0241396 A1 Sep. 19, 2013

(30) Foreign Application Priority Data

Mar. 15, 2012 (JP) .................. 2012-058152

(51) Int. Cl.
*H01L 33/50* (2010.01)

(52) U.S. Cl.
CPC .................... *H01L 33/504* (2013.01)
USPC .......................... 313/503; 313/501

(58) Field of Classification Search
CPC .................................................. H01L 33/504
USPC ............................................. 313/501, 503
See application file for complete search history.

(56) References Cited

U.S. PATENT DOCUMENTS

| | | | |
|---|---|---|---|
| 7,015,510 B2 | 3/2006 | Srivastava et al. | |
| 2003/0067008 A1* | 4/2003 | Srivastava et al. | 257/79 |
| 2006/0169998 A1* | 8/2006 | Radkov et al. | 257/98 |
| 2007/0241661 A1* | 10/2007 | Yin | 313/502 |
| 2009/0267484 A1* | 10/2009 | Kasakura et al. | 313/502 |
| 2010/0096974 A1 | 4/2010 | Setlur et al. | |
| 2010/0164365 A1* | 7/2010 | Yoshino et al. | 313/503 |
| 2010/0194263 A1* | 8/2010 | Winkler et al. | 313/486 |
| 2010/0231121 A1* | 9/2010 | Kaneda et al. | 313/503 |

FOREIGN PATENT DOCUMENTS

| | | |
|---|---|---|
| JP | 2009-528429 | 8/2009 |
| JP | 2010-100825 | 5/2010 |
| JP | 2010-280877 | 12/2010 |
| JP | 2011-176276 | 9/2011 |
| WO | WO 2007/100824 A2 | 9/2007 |
| WO | WO 2010/143618 A1 | 12/2010 |

OTHER PUBLICATIONS

International Search Report with Written Opinion issued on May 14, 2013 in PCT/JP2013/056479 filed Mar. 8, 2013 (with partial English translation).

* cited by examiner

*Primary Examiner* — Nimeshkumar Patel
*Assistant Examiner* — Steven Horikoshi
(74) *Attorney, Agent, or Firm* — Oblon, Spivak, McClelland, Maier & Neustadt, L.L.P.

(57) ABSTRACT

A white light emitting device includes a light emitting element having a peak wavelength at from 430 nm to 460 nm; and a fluorescent layer on the light emitting element containing a red fluorescent material and a green-yellow fluorescent material. The white light emitting device achieves high color rendering properties, a high average color rendering index Ra and a high luminescent efficiency, or a high white efficiency.

9 Claims, 5 Drawing Sheets

WHITE LIGHT EMITTING DEVICE WITH RED AND GREEN-YELLOW PHOSPHOR

CROSS-REFERENCE TO RELATED APPLICATION

This application is based upon and claims the benefit of priority from Japanese Patent Application No. 2012-058152, filed on Mar. 15, 2012, the entire contents of which are incorporated herein by reference.

FIELD

Embodiments described herein relate generally to a white light emitting device.

BACKGROUND

Light emitting devices using a light emitting diode (LED) are mainly composed of a combination of an LED chip as an excitation light source and a fluorescent material. Further, a variety of luminescent colors can be achieved depending on the combination.

For white LED light emitting devices for emitting white light, a combination of an LED chip for emitting light in a blue range with a fluorescent material is used. Examples of the combination include, for example, a combination of an LED chip for emitting blue light with a mixture of fluorescent materials. As the fluorescent material, a yellow fluorescent material is mainly used which emits light complementary to blue, and with the LED chip, used as a pseudo white light LED. Besides, three-wavelength white LEDs have been developed which use an LED chip for emitting blue light, a green to yellow fluorescent material, and a red fluorescent material.

It is desirable for white LED light emitting devices to be used for lighting purposes (hereinafter, referred to as white light emitting devices) to achieve high color rendering properties, in particular, a high average color rendering index (Ra) in order to reproduce a color close to natural light. In addition, for lower power consumption, the devices require a balance with a high luminescent efficiency.

DETAILED DESCRIPTION

Figure 1:
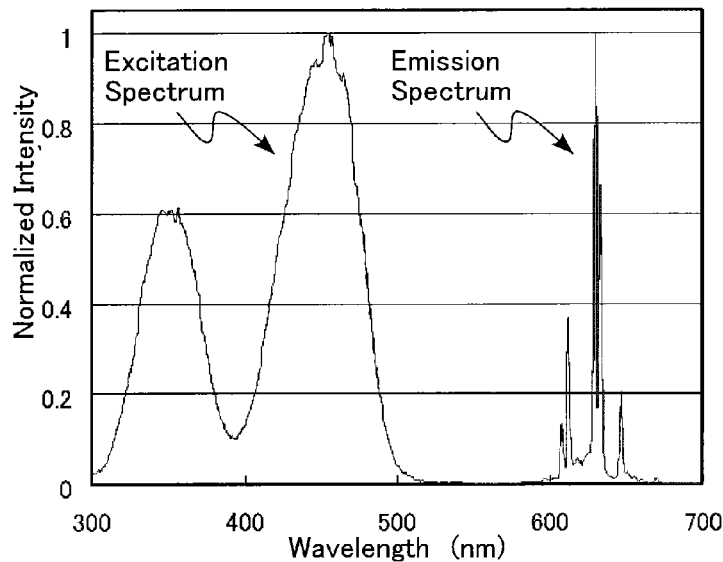
FIG. 1 is a diagram showing an emission spectrum for a red fluorescent material according to an embodiment.

A white light emitting device according to an embodiment includes: a light emitting element which has a peak wavelength in a wavelength range of 430 nm or more and 460 nm or less; and a fluorescent layer which is formed on the light emitting element and contains a red fluorescent material and a green-yellow fluorescent material, and when a peak wavelength of a fluorescent material, a full width at half maximum of light emitted from a fluorescent material, an effective wavelength width of a spectrum for light emitted from a fluorescent material, and an external quantum efficiency of a fluorescent material are respectively denoted by $\lambda p$, FWHM, EWW, and $\eta$, the red fluorescent material has the characteristics of: $625$ nm$\leq\lambda p\leq 635$ nm; $15$ nm$\leq$EWW$\leq 45$ nm; and $40\%\leq\eta\leq 75\%$, and the green-yellow fluorescent material has the characteristics of: $545$ nm$\leq\lambda p\leq 565$ nm; $90$ nm$\leq$FWHM$\leq 125$ nm; and $70\%\leq\eta\leq 90\%$.

An embodiment will be described below with reference to the drawing.

A white light emitting device according to the embodiment includes: a light emitting element which has a peak wavelength in a wavelength range of 430 nm or more and 460 nm or less; and a fluorescent layer which is formed on the light emitting element and contains a red fluorescent material and a green-yellow fluorescent material. Further, when a peak wavelength of a fluorescent material, a full width at half maximum of light emitted from a fluorescent material, an effective wavelength width of a spectrum for light emitted from a fluorescent material, and an external quantum efficiency of a fluorescent material are respectively denoted by $\lambda p$, FWHM, EWW, and $\eta$, the red fluorescent material has the characteristics of: $625$ nm$\leq\lambda p\leq 635$ nm; $15$ nm$\leq$EWW$\leq 45$ nm; and $40\%\leq\eta\leq 75\%$, and the green-yellow fluorescent material has the characteristics of: $545$ nm$\leq\lambda p\leq 565$ nm; $90$ nm$\leq$FWHM$\leq 125$ nm; and $70\%\leq\eta\leq 90\%$.

The white light emitting device according to the present embodiment has the configuration described above, thereby making it possible to achieve high color rendering properties, in particular, a high average color rendering index Ra and a high luminescent efficiency, in particular, a high white efficiency.

It is to be noted that in this specification, $\lambda p$ represents a peak wavelength for each fluorescent material, FWHM represents a full width at half maximum for a spectrum produced from a fluorescent material, EWW represents an effective wavelength width for a spectrum produced from a fluorescent material, $\eta$ represents an external quantum efficiency for a fluorescent material, and $\eta'$ represents an internal quantum efficiency for a fluorescent material.

The peak wavelength refers to a wavelength corresponding to the highest emission intensity in an emission spectrum which can be obtained by excitation of a fluorescent material with near-ultraviolet outside light with an emission peak around 400 nm or blue light with an emission peak around 430 to 460 nm, and by measurement with an optical measurement device such as, for example, C9920-02G from Hamamatsu Photonics K.K.

The full width at half maximum (FWHM) is defined by the difference between the maximum wavelength and the minimum wavelength among the wavelengths corresponding to ½ the maximum emission intensity of the peak with the peak wavelength described above in the emission spectrum.

In addition, the effective wavelength width (EWW) is defined as follows. In the case of a fluorescent material which has one or two or more emission peaks in an emission spectrum, a peak which has an intensity of 15% or more of the maximum peak is defined as a sub-peak. Then, the difference between the maximum wavelength and the minimum wavelength, among the wavelengths which exhibit 15% of the maximum peak intensity, including the maximum peak and the sub-peak, is defined as the effective wavelength width EWW.

In addition, the external quantum efficiency η refers to a value calculated by multiplying the absorptance α and internal quantum efficiency η' defined by the following formulas (I) and (II).

$$\alpha = \frac{\int \lambda \cdot [E(\lambda) - R(\lambda)] d\lambda}{\int \lambda \cdot [E(\lambda)] d\lambda} \quad (I)$$

In the formula, E(λ) represents the whole spectrum (in terms of the number of photons) of an excitation light source for irradiating a fluorescent material. In addition, R(λ) represents a reflectance spectrum (in terms of the number of photons) of a fluorescent material for an excitation light source.

$$\eta' = \frac{\int \lambda \cdot [P(\lambda)] d\lambda}{\int \lambda \cdot [E(\lambda) - R(\lambda)] d\lambda} \quad (II)$$

In the formula, P(λ) represents an emission spectrum (in terms of the number of photons) of a fluorescent material.

$$\eta = \frac{\int \lambda \cdot [P(\lambda)] d\lambda}{\int \lambda \cdot [E(\lambda)] d\lambda} \quad (III)$$

More specifically, it is possible to calculate the external quantum efficiency by the formula (III)=formula (I)×formula (II).

It is to be noted that the absorptance α refers to a numerical value obtained by dividing, by the total number of photons of excitation light for irradiating a fluorescent material, the number of photons obtained by subtracting the number of photons of excitation light reflected from the fluorescent material from the total number of photons. In addition, the internal quantum efficiency η' refers to a numerical value obtained by dividing the number of photons of a spectrum produced from a fluorescent material by the number of photons (absorptance) absorbed by the fluorescent material. The external quantum efficiency η refers to a numerical value obtained by dividing the total number of photons of a spectrum produced from a fluorescent material by the total number of photons of an excitation light source for irradiating the fluorescent material.

In addition, the external quantum efficiency η, internal quantum efficiency η', and absorptance α can be obtained by measurement with an optical measurement device such as, for example, C9920-02G from Hamamatsu Photonics K.K. Blue light with a peak wavelength around 430 to 460 nm and a full width at half maximum of 5 to 15 nm is used as the excitation light in the measurement of the emission characteristics.

The inventors have focused attention on the possibility of using, in a white light emitting device, an $Eu^{2+}$ activated red fluorescent material which is often reported in blue-excitation white solid light sources, for example, a red fluorescent material which has a narrower emission spectrum width as compared with a CASN with $CaAlSiN_3$:Eu as a basic composition, a SCASN with a lot of strontium (Sr) substitution in the CASN, etc., in order to achieve a balance between the color rendering properties and the luminescent efficiency. Then, the inventors have examined the characteristics of a green-yellow fluorescent material combined in order to achieve white light. As a result, the characteristics have been found which are required for the green-yellow fluorescent material in order to achieve a balance between the color rendering properties and the luminescent efficiency.

First, in the white light emitting device according to the embodiment, a light emitting element with a peak wavelength in a wavelength range of 430 nm or more and 460 nm or less is used as a light source for blue light and excitation light. The light emitting element is, for example, a blue LED (Light Emitting Diode). A light emitting element with an emission peak wavelength less than 430 nm will undergo a decrease in color rendering properties, even in combination with the red fluorescent material and green-yellow fluorescent material according to the embodiment. Alternatively, a light emitting element with an emission peak wavelength greater than 460 nm will undergo a decrease in the output of the light emitting element.

Further, the white light emitting device according to the embodiment includes a fluorescent layer which is formed on the light emitting element and contains a red fluorescent material and a green-yellow fluorescent material.

The red fluorescent material according to the embodiment has the characteristics of: 625 nm≤λp≤635 nm; 15 nm≤EWW≤45 nm; and 40%≤η≤75%.

Examples of the red fluorescent material which has these characteristics include, for example, a fluoride fluorescent material which has the composition represented by the following general formula (1). Hereinafter, this red fluorescent material is expressed by an abbreviation of KSF below.

$$A_a(M_{1-s},Mn_s)F_b \quad (1)$$

In the formula, A represents at least one element selected from K (potassium) and Cs (cesium), M represents at least one element selected from Si (silicon) and titanium (Ti), and a, b, and s represent numerical values which respectively satisfy 1.7≤a≤2.1, 5.3≤b≤6.3, and 0<s≤0.05.

FIG. 1 is a diagram showing an emission spectrum for a red fluorescent material according to an embodiment. Shown are an excitation light spectrum and an emission spectrum for a red fluorescent material KSF. As shown in the figure, the red fluorescent material KSF has a sharp peak wavelength λp near a wavelength of 630 nm, and has two sub-peaks on the both sides of the main peak. From the result of the study carried out by the inventors, it has become clear that the presence of these sub-peaks acts effectively for improving the color rendering properties.

The red fluorescent material represented by the general formula (1) is able to be produced by, for example, the following synthesis method. A Si substrate and a Ti target, as well as a metal or oxide material including an element M, such as $SiO_2$ pieces, Si, Ti, or $SiO_2$ powder, is put into a reaction solution obtained in advance by mixing, with a HF solution, a permanganate solution in which a permanganate powder including an element A, such as $KMnO_4$, is dissolved in water.

Thus, the red fluorescent material KSF of the general formula (1) can be obtained by the following chemical reaction.

It is also possible to synthesize the fluorescent material of the general formula (1) by other solution reaction method or solid phase reaction method, besides the synthesis method described above.

The red fluorescent material KSF contains manganese (Mn) as a luminescent center. Therefore, s in the general formula (1) is greater than 0. If Mn is not contained (s=0), no luminescence can be obtained even in the case of excitation by light with an emission peak in a blue range. Furthermore, the content of such an activator agent has an upper limit for the following reason.

If the content of Mn is excessively high, a concentration quenching phenomenon will be caused to diminish the luminescence intensity of the fluorescent material represented by the general formula (1). In order to avoid these disadvantages, the content (s) of Mn has a specified upper limit of 0.05. The upper limit is preferably 0.03.

For analyzing the contents of the other elements, the synthesized fluorescent material is subjected to alkali fusion by decomposition with an acid under pressure, for metal elements such as K, Cs, Si, Ti, Mn. Then, for example, with IRIS Advantage from Thermo Fisher Scientific K.K., an analysis is carried out by ICP emission spectroscopy or an atomic absorption method. In addition, for the non-metal element F, the synthesized fluorescent material is subjected to separation by thermal hydrolysis. Then, for example, with DX-120 from Nippon Dionex K.K., an analysis is carried out by ion chromatography. In this way, it is possible to analyze the composition of the fluorescent material represented by the general formula (1).

As a result of experiments repeated by the inventors, it has become clear that the external quantum efficiency $\eta$ of the fluorescent material represented by the general formula (1) is impaired if the value of a falls outside the range of 1.7 to 2.1, or if the value of b falls outside the range of 5.3 to 6.3.

In addition, oxygen (O) may be mixed inevitably in some cases, due to the surface decomposition of the fluorescent material in the synthesis process and after the synthesis. The abundance of O is desirably zero because O is not a constituent element in the general formula (1). However, O may be contained as long as the abundance falls within the range less than O/(F+O)=0.01, because the external quantum efficiency $\eta$ is not seriously impaired.

Furthermore, Na, Rb, $NH_4$, and the like as the element A of the fluorescent material represented by the general formula (1), and Ge, Sn, and the like as the element M thereof also exhibit similar emission spectra. However, these elements will lead to high cost in terms of the stability of the fluorescent material, the easy-to-synthesize the fluorescent material, and the rate of reaction. For this reason, the composition is limited to the elements according to the embodiment. However, the elements other than those according to the embodiment may be mixed in such minute amounts that will not impair the basic structure, emission characteristics, stability, etc, of the fluorescent material.

It is to be noted that the spectrum shape of the red fluorescent material represented by the general formula (1) has a low composition dependence.

The external quantum efficiency and internal quantum efficiency of the red fluorescent material are related to the white efficiency of a light emitting device, and the white efficiency of the light emitting device is increased as the external quantum efficiency and the internal quantum efficiency, in particular, the internal quantum efficiency is higher. Therefore, the external quantum efficiency and internal quantum efficiency of the red fluorescent material, in particular, the internal quantum efficiency is desirably higher.

In order to provide a lighting device which achieves a balance between the luminescence efficiency and the color rendering properties, the red fluorescent material represented by the general formula (1) desirably has an external quantum efficiency $\eta$ of 40% or more. In particular, the internal quantum efficiency $\eta'$ is desirably 60% or more, which greatly affects the efficiency characteristics of the fluorescent material and lighting device.

For the red fluorescent material KSF represented by the general formula (1), the external quantum efficiency $\eta$ varies depending on the synthesis process conditions, the posttreatment for the synthesized fluorescent material, the storage condition, etc. While the external quantum efficiency $\eta$ has a theoretical maximum value of 100%, the upper limit of the external quantum efficiency is considered 75% from the aspect of manufacturing cost such as the yield.

Therefore, the external quantum efficiency $\eta$ of the red fluorescent material is desirably 40%≤$\eta$≤75%, whereas the internal quantum efficiency $\eta'$ thereof is desirably 60% or more.

The green-yellow fluorescent material according to the embodiment has the characteristics of: 545 nm≤$\eta$p≤565 nm; 90 nm≤FWHM≤125 nm; and 70%≤$\eta$≤90%.

Examples of the green-yellow fluorescent material which has these characteristics include fluorescent materials represented by the following general formulas (2) and (3).

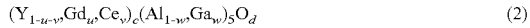  (2)

In the formula, c, d, u, v, and w represent numerical values which satisfy 2.8≤c≤3.2, 11.5≤d≤12.5, 0≤u≤0.2, 0.02≤v≤0.15, and 0≤w≤0.3.

  (3)

In the formula, e, f, x, y, and z represent numerical values which satisfy 1.9≤e≤2.1, 3.6≤f≤4.1, 0.15≤x≤0.4, 0≤y≤0.1 0<z≤0.15.

As in the case of the fluorescent material represented by the general formula (1), the fluorescent material represented by the general formula (2) contains cerium (Ce) as a luminescent center, whereas the fluorescent material represented by the general formula (3) contains europium (Eu) as a luminescent center. Therefore, v and z in the general formulas (2) and (3) are greater than 0. If the concentration of luminescent center element is excessively high, concentration quenching will be caused to decrease the external quantum efficiency. Therefore, v and z each have an upper limit of 0.15.

It is known that the peak wavelength of the fluorescent material represented by the general formula (2) is shifted to a longer wavelength when gadolinium (Gd) is added, whereas the peak wavelength is shifted to a shorter wavelength when gallium (Ga) is added. In addition, it is also known that the peak wavelength is shifted to a longer wavelength when the cerium (Ce) concentration is increased. In order to satisfy the emission spectrum shape and efficiency according to the embodiment, u, v, and w need to satisfy the relationships mentioned above. In addition, if the c and d values fall outside the ranges of the relationships, the external quantum efficiency $\eta$ is decreased. Therefore, c and d, and u, v, and w need to satisfy the relationships mentioned above.

As the fluorescent material which has the composition represented by the general formula (2), fluorescent materials are also known to which terbium (Tb) or lutetium (Lu) is added in place of yttrium (Y). However, Tb and Lu are high-cost elements among rare-earth elements, and thus have disadvantage such as an increase in the manufacturing cost of the fluorescent material. Therefore, Gd and Ga are suitable as additive elements for adjusting the emission spectrum shape.

It is known that the peak wavelength of the fluorescent material represented by the general formula (3) is shifted to a longer wavelength when calcium (Ca) is added, whereas the peak wavelength is shifted to a shorter wavelength when barium (Ba) is added. In addition, it is known that the peak wavelength is shifted to a longer wavelength when the europium (Eu) concentration is increased. In order to satisfy the emission spectrum shape and efficiency according to the embodiment, x, y, and z need to satisfy the relationships mentioned above. In addition, if the e and f values fall outside the ranges of the relationships, the external quantum efficiency is decreased. Therefore, e and f, and x, y, and z need to satisfy the relationships mentioned above.

In particular, when the Ca additive amount, y value is increased, the crystal system of the fluorescent material is changed to a hexagonal system, thereby resulting in a decrease in internal quantum efficiency $\eta'$. In addition, the first metal element composition of the fluorescent material which has the composition represented by the general formula (3) desirably, in terms of emission spectrum shape and external quantum efficiency, contains strontium (Sr) as its main constituent, with other alkali metal elements such as barium (Ba) and calcium (Ca) added in predetermined amounts. This is because only Sr, or the excessively low additive amount of Ba, Ca, and the like, changes the crystal system of the fluorescent material which has the composition represented by the general formula (3) to a monoclinic system, thereby resulting in a decrease in external quantum efficiency $\eta$. For the reason mentioned above, the lower limit of the x value and the upper limit of the y value are limited.

The external quantum efficiency and internal quantum efficiency of the green-yellow fluorescent material are related to the white efficiency of a light emitting device, and the white efficiency of the light emitting device is increased as the external quantum efficiency and the internal quantum efficiency, in particular, the internal quantum efficiency is higher. Therefore, the external quantum efficiency and internal quantum efficiency of the green-yellow fluorescent material, in particular, the internal quantum efficiency is desirably higher.

In order to provide a lighting device which achieves a balance between the luminescent efficiency and the color rendering properties, the green-yellow fluorescent materials represented by the general formulas (2) and (3) desirably have an external quantum efficiency $\eta$ of 70% or more. In particular, the internal quantum efficiency $\eta'$ is desirably 85% or more, which greatly affects the efficiency characteristics of the fluorescent material and lighting device.

For the green-yellow fluorescent materials which have the compositions represented by the general formulas (2) and (3), the external quantum efficiency $\eta$ varies depending on the synthesis process conditions, the posttreatment for the synthesized fluorescent material, etc. While the external quantum efficiency $\eta$ has a theoretical maximum value of 100%, the upper limit of the external quantum efficiency $\eta'$ is considered 90% from the aspect of manufacturing cost such as the yield.

Therefore, the external quantum efficiency $\eta$ of the green-yellow fluorescent material is desirably $70\% \leq \eta \leq 90\%$, whereas the internal quantum efficiency $\eta'$ thereof is desirably 85% or more.

Furthermore, while the fluorescent materials represented by the general formulas (2) and (3) have the constituent elements as described above, elements other than the elements mentioned above may be mixed in such minute amounts that will not impair the basic structures, emission characteristics, stability, etc, of the fluorescent materials. For example, the elements constituting a flux added in the synthesis, and the elements of constituent materials for a calcination device will remain in minute amount, even if cleaning is carried out.

In addition, it is possible to use fluorescent materials other than the above type of fluorescent material as the green-yellow fluorescent material, as long as the other fluorescent materials satisfy the characteristics of: 545 nm$\leq \lambda p \leq$565 nm; 90 nm$\leq$FWHM$\leq$125 nm; and 70%$\leq \eta \leq$90%. Specific Examples of the other fluorescent materials include silicate fluorescent materials such as $Ca_3(Sc,Mg)_2Si_3O_{12}$:Ce and $Li_2(Sr,Ca,Ba)SiO_4$:Eu; oxide fluorescent materials such as $(Ca,Mg)Sc_2O_4$:Ce; sulfide fluorescent materials such as $(Ca,Sr,Ba)Ga_2S_4$:Eu; and alkaline-earth nitride fluorescent materials such as $(Ca,Sr,Ba)Si_2O_2N_2$:Eu.

However, in terms of luminescent efficiency, chemical stability, and manufacturing cost, it is desirable to apply the green-yellow fluorescent materials which have the compositions represented by the general formulas (2) and (3).

In order to achieve high color rendering properties and a high luminescent efficiency, simulation research was carried out for deriving the characteristics required for the red fluorescent material of the general formula (1) and the green-yellow fluorescent material added thereto. This result will be described.

The following method of calculation was implemented for the simulation. An excitation light source (blue LED) is used to calculate emission characteristics of a white light source for emitting light from a fluorescent layer of two types of fluorescent materials mixed: a red fluorescent material and a green-yellow fluorescent material. The emission spectrum of the white light source is calculated as the sum of spectra for the individual fluorescent materials and excitation source in the output plane. In addition, the absorptance $\alpha$ and internal quantum efficiency $\eta'$ for the constituent fluorescent materials are calculated from values measured in powders. Further, the emission spectrum of the white light source is calculated as the sum of leakage light of the excitation light and luminescence output from the fluorescent materials, which is obtained when the incident energy of the excitation light source is assumed to be 1 [W].

In addition, the proportions of the fluorescent materials are all adjusted so that the color temperature corresponds to a bulb color (2800 K). The color temperature such as the bulb color and the range thereof conform to the JIS (Japanese Industrial Standards).

As described above, for the evaluation by the simulation, the white efficiency is used as an index for the luminescent efficiency of the white light source. The white efficiency herein indicates light output (excitation light W) before applying a fluorescent layer, which is divided by light output (luminous flux–lumen(lm)) after applying the fluorescent layer–the light conversion efficiency (lumen (lm)/excitation light W). The above index is used in order to eliminate the influence from the efficiency of the light emitting element used and estimate the genuine conversion efficiency of the fluorescent layer.

For the color rendering properties, an average color rendering index Ra is used as an index. The average color rendering index Ra refers to, with respect to eight types of standard colors to be tested, an average value obtained by quantifying the magnitude of a color deviation from a sample light source with respect to reference light at each color temperature. For the calculation of the color rendering properties, the wavelength width of the fluorescent material is defined as values by 5 nm for the fluorescent materials in this specification, in order to perform calculations by 5 nm for spectra. The detailed method for calculating the color rendering properties is standardized by the JIS (Z8726-1990).

While varying the types and compositions of the red fluorescent material and green-yellow fluorescent material, the emission spectra for each fluorescent material were used to run simulations. As the red fluorescent material, a KSF fluorescent material, and a CASN fluorescent material and a SCASN fluorescent material were used which are represented by the general formula (1). For the green-yellow fluorescent material, various types and compositions were used, including the fluorescent materials of the general formulas (2) and (3).

Figure 2:
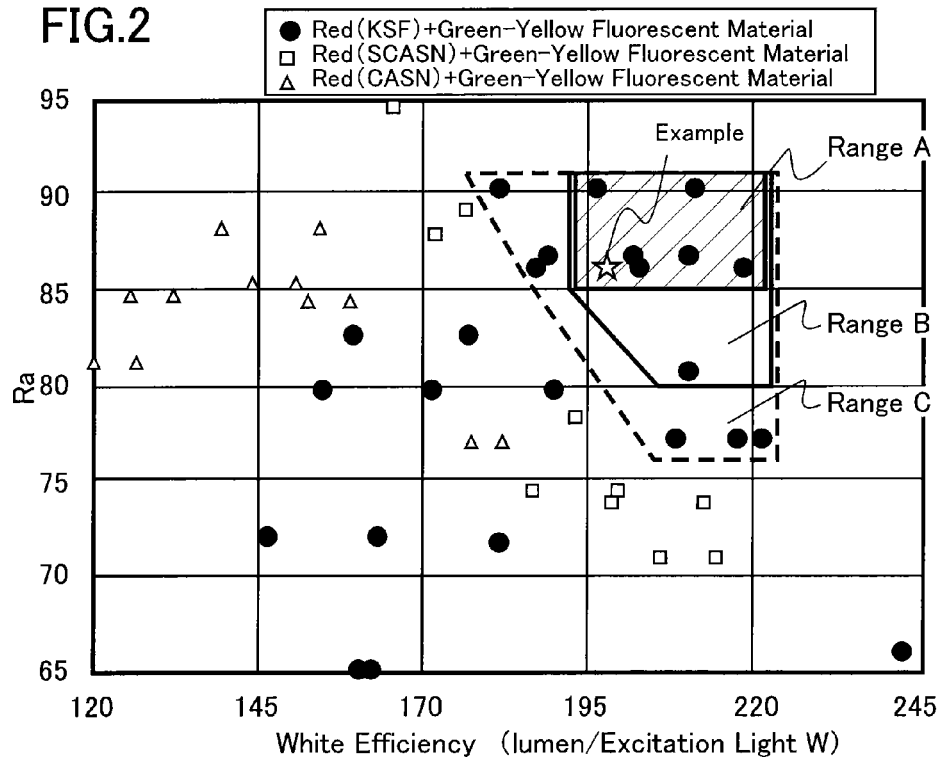
FIG. 2 is a diagram showing simulation results which indicate a relationship between a white efficiency and Ra.

FIG. 2 is a diagram showing simulation results which indicate a relationship between the white efficiency and the Ra. As in the case of range A indicated by a dotted line (hereinafter, range C) in FIG. 2, the use of the KSF fluorescent material according to the embodiment achieves a balance between high color rendering properties and a high luminescent efficiency, which is not able to be achieved by the CASN fluorescent material or the SCASN fluorescent material. Further, a balance between higher color rendering properties and a higher luminescent efficiency is achieved in a range indicated by a solid line (hereinafter, range B). Furthermore, a balance between much higher color rendering properties and a much higher luminescent efficiency is achieved in a range indicated by a solid line and hatching (hereinafter, range A).

However, it is also clear from FIG. 2 that it is not always possible to achieve a balance between high color rendering properties and a high luminescent efficiency, depending on the type or composition of the green-yellow fluorescent material combined, even in the case of using the KSF fluorescent material according to the embodiment. More specifically, there are cases outside the area C, the area B, or the area A.

Figure 3:
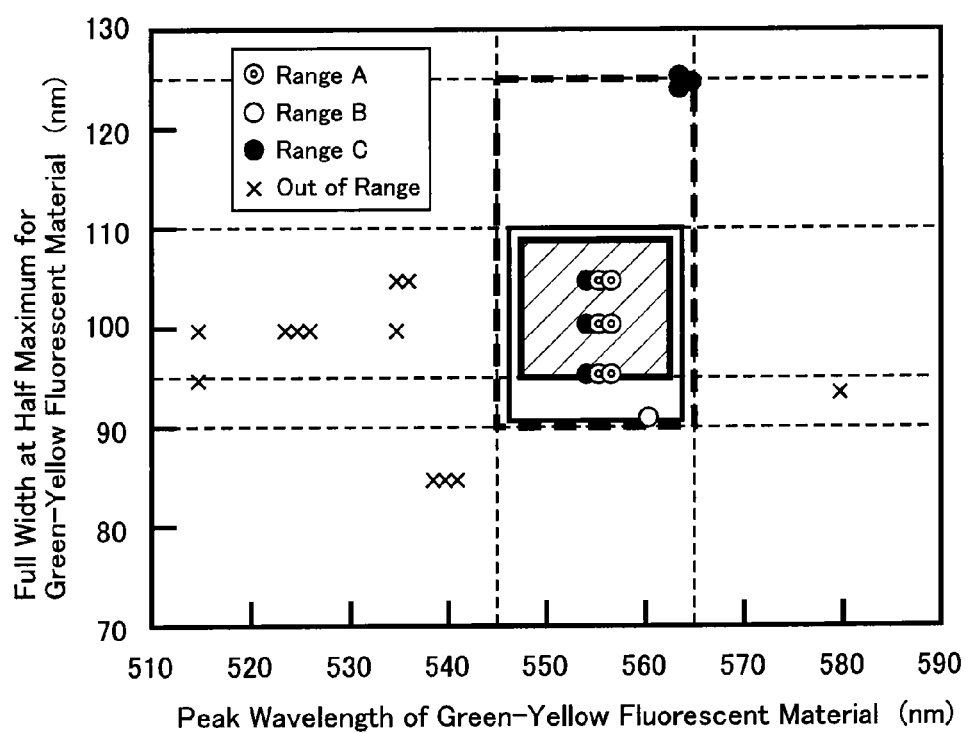
FIG. 3 is a diagram showing a relationship between the peak wavelength and full width at half maximum for a green-yellow fluorescent material and emission characteristics thereof.

FIG. 3 is a diagram showing a relationship between the peak wavelength and full width at half maximum for the green-yellow fluorescent material and emission characteristics thereof. The simulation results for the KSF fluorescent material are classified into the group of samples in the range A (double circles in the figure), the group of samples in the range B but outside the range A (white circles in the figure), the group of samples in the range C but outside the range B (black circles in the figure), and the group of samples outside the range C (marks x in the figure), and plotted in the graph of the peak wavelength and full width at half maximum for the green-yellow fluorescent material.

As is clear from the figure, it is determined that a high luminescent efficiency and high color rendering properties are achieved when the green-yellow fluorescent material has a peak wavelength and a full width at half maximum within a certain range. In order to at least fall within the range C, the green-yellow fluorescent material satisfies 545 nm≤λp≤565 nm and 90 nm≤FWHM≤125 nm (dotted frame) from FIG. 3.

It is to be noted that the samples in the range A, the range B, and the range C all satisfy 70%≤η≤90%.

Further, in order to exhibit characteristics in range B, it is desirable to satisfy 90 nm≤FWHM≤110 nm (solid frame) and 75%≤η.

Furthermore, in order to exhibit characteristics in range A, it is desirable to satisfy 95 nm≤FWHM≤110 nm (solid frame+hatching) and 75%≤η.

Tables 1 and 2 show, as examples, some characteristics of the red fluorescent materials and green-yellow fluorescent materials in the samples used for the simulations. In addition, Table 3 shows the simulation results.

It is to be noted that in the tables, samples 1 to 6 use the KSF fluorescent material according to the embodiment, and show results which fall within the range in which a balance is achieved between high color rendering properties and a high luminescent efficiency (range C). In addition, sample 7 uses the KSF fluorescent material according to the embodiment, but show results outside the range C. Furthermore, sample 8 is a case of using the CASN fluorescent material as the red fluorescent material, in place of the KSF fluorescent material in sample 1.

TABLE 1

Red Fluorescent Material

| No. | Type of Fluorescent Material | λp (nm) | EWW (nm) | η (%) | η' (%) |
|---|---|---|---|---|---|
| 1 | K1.8(Si0.99,Mn0.01)F5.3 | 630 | 45 | 48 | 67 |
| 2 | K2.1(Si0.98,Mn0.02)F6.3 | 630 | 45 | 45 | 65 |
| 3 | K1.7(Si0.98,Mn0.02)F5.4 | 630 | 45 | 53 | 75 |
| 4 | K2.1(Si0.99,Mn0.01)F6.1 | 630 | 45 | 46 | 69 |
| 5 | (K,Cs)1.9(Si0.99,Mn0.01)F5.9 | 630 | 45 | 42 | 68 |
| 6 | (K,Cs)1.8(Ti0.99,Mn0.01)F5.8 | 630 | 45 | 40 | 60 |
| 7 | K1.8(Si0.99,Mn0.01)F5.3 | 630 | 45 | 48 | 67 |
| 8 | (Ca0.98,Eu0.02)AlSiN3 | 655 | 160 | 80 | 90 |

TABLE 2

Green-Yellow Fluorescent Material

| No. | Type of Fluorescent Material | λp (nm) | FWHM (nm) | η (%) | η' (%) |
|---|---|---|---|---|---|
| 1 | (Y0.98,Ce0.02)3.04Al5O11.8 | 555 | 105 | 87 | 96 |
| 2 | (Ba0.30,Sr0.61,Eu0.09)1.95SiO3.7 | 560 | 95 | 90 | 97 |
| 3 | (Ba0.19,Sr0.76,Eu0.05)2.03SiO3.7 | 555 | 100 | 75 | 94 |
| 4 | (Y0.97,Gd0.01,Ce0.02)2.9Al5O11.5 | 560 | 110 | 81 | 95 |
| 5 | (Y0.98,Ce0.02)3.1(Al0.7,Ga0.3)5O12.3 | 545 | 105 | 85 | 95 |
| 6 | (Ba0.40,Sr0.50,Ca0.05,Eu0.05)2.05SiO4.05 | 560 | 100 | 75 | 90 |
| 7 | (Y0.99,Ce0.01)3.01(Al0.71,Ga0.29)5O11.6 | 525 | 105 | 82 | 95 |
| 8 | (Y0.98,Ce0.02)3.04Al5O11.8 | 555 | 105 | 87 | 96 |

TABLE 3

| No. | White Efficiency lm/excitation light W | Ra |
|---|---|---|
| 1 | 196 | 90 |
| 2 | 197 | 86 |
| 3 | 197 | 87 |
| 4 | 201 | 85 |
| 5 | 190 | 86 |
| 6 | 185 | 85 |
| 7 | 163 | 72 |
| 8 | 155 | 88 |

Figure 4A:
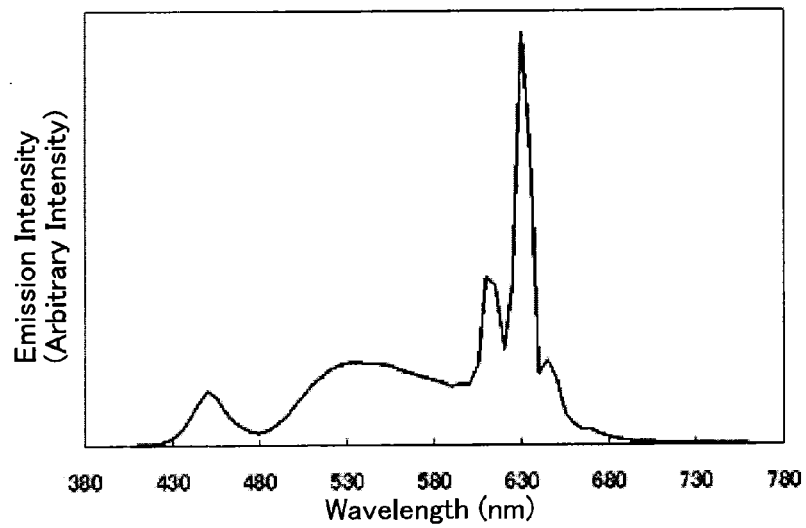
FIGS. 4A and 4B are diagrams showing emission spectra obtained from simulations.
Figure 4B:
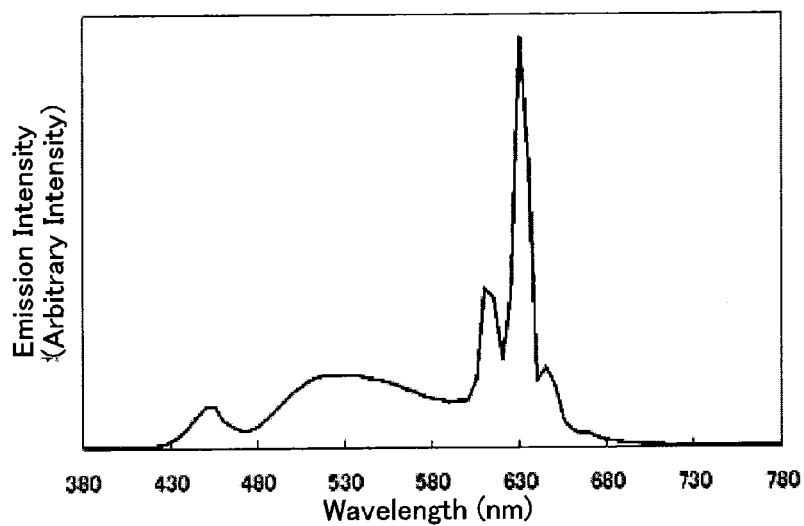

FIGS. 4A and 4B are diagrams showing emission spectra obtained from the simulations. FIG. 4A shows the case of sample 1 in the range in which a balance is achieved between high color rendering properties and a high luminescent efficiency, whereas FIG. 4B shows the case of sample 7 outside the range in which a balance is achieved between high color rendering properties and a high luminescent efficiency.

It is considered for the following reason that the embodiment allows a high luminescent efficiency to be achieved. In the case of the red fluorescent material such as the CASN fluorescent material and the SCASN fluorescent material, it is possible, because of their broad emission spectrum widths, to provide white light emitting devices with Ra higher than 95. However, the long-wavelength side component of the red spectrum causes a loss, because the component loses touch with the luminosity curve. In the case of the CASN fluorescent material or the SCASN fluorescent material, the luminescent efficiency is decreased for the achievement of high color-rendering white light emitting devices, because the area overlapping with the luminosity curve is reduced due to the broad emission spectrum in the red range.

In addition, the excitation spectrum of the CASN fluorescent material or the SCASN fluorescent material extends to near a skirt of the emission spectrum. Therefore, it is not possible to avoid a reabsorption phenomenon in which the CASN fluorescent material or the SCASN fluorescent material again absorbs, for producing luminescence, luminescence from the green-yellow fluorescent material which absorbs blue excitation light to produce luminescence, and this reabsorption phenomenon also decreases the luminescent efficiency of the white light emitting device.

In the case of the red fluorescent material according to the embodiment, the area overlapping with luminosity curve can be increased because of the narrow emission spectrum width. For this reason, the loss can be reduced. Then, the red fluorescent material in combination with the green-yellow fluorescent material according to the embodiment achieves a balance between high color rendering properties and a high luminescent efficiency.

It is to be noted that in the case of the white light emitting device according to the embodiment, the red fluorescent material has a characteristic spectrum shape, and the difference in emission spectrum between the white light emitting device and an existing lighting device is pronounced in a low color-temperature range in which the red fluorescent material is frequently used. For this reason, the white light emitting device according to the embodiment desirably has a color temperature in a bulb color range.

In the white light emitting device according to the embodiment, it is also possible to mix fluorescent materials other than the red fluorescent material and the green-yellow fluorescent material. It is also possible to further improve the color rendering properties by adding these fluorescent materials.

However, due to two or more fluorescent materials, there is concern about a decrease in luminescent efficiency through reabsorption. Therefore, the fluorescent layer desirably has therein only two types of fluorescent materials in total: one type for each of the red fluorescent material and the green-yellow fluorescent material.

Figure 5:
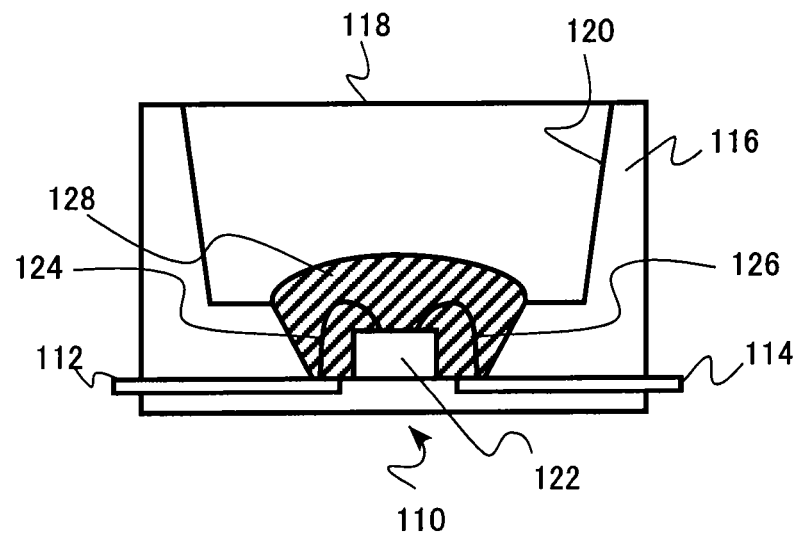
FIG. 5 is a cross-sectional view illustrating an example of a white light emitting device according to an embodiment.

FIG. 5 is a cross-sectional view illustrating an example of a white light emitting device according to an embodiment.

The white light emitting device shown includes a resin stem 110. The resin stem 110 has a lead 112 and a lead 114, and a resin portion 116 formed integrally on the leads. The resin portion 116 includes a concave section 118 with an upper opening larger than the bottom, and the side surface of the concave section is provided with a reflecting surface 120.

The concave section 118 has, on a central portion of the substantially circular bottom, a light emitting chip 122 mounted with an Ag paste or the like. The light emitting chip 122 is a light emitting element which has a peak wavelength in a wavelength range of 430 nm or more and 460 nm or less. For example, it is possible to use a semiconductor light emitting diode such as a GaN or InGaN based light emitting diode.

The light emitting chip 122 has electrodes (not shown) respectively connected to the lead 112 and the lead 114 through bonding wires 124 and 126 of Au or the like. It is to be noted that the arrangement of the leads 112 and 114 can be changed appropriately.

The concave section 118 of resin portion 116 has a fluorescent layer 128 placed therein. The fluorescent layer 128 can be formed by dispersing the two types of: the red fluorescent material and the green-yellow fluorescent material according to the embodiment, at a ratio of 5 wt % or more and 50 wt % or less in a resin of, for example, a silicone resin. The fluorescent materials can be attached with a variety of binders such as an resin that is an organic material or glass that is an inorganic material.

As the binder of an organic material, transparent resins which have excellent light resistance, such as an epoxy resin and an acrylic resin, are suitable in addition to the silicone resin mentioned above. Materials suitable as the binder of an inorganic material include: low-melting-point glass which uses an alkaline-earth borate or the like; ultrafine silica and alumina for attaching the fluorescent materials which have large grain sizes; alkaline-earth phosphates which are obtained by a precipitation method. These binders may be used by themselves, or two or more of the binders may be used in combination.

In addition, a coating process can be applied to the surfaces of the fluorescent materials for use in the fluorescent layer 28, if necessary. This surface coating prevents the fluorescent materials from degradation due to external factors such as heat, humidity, ultraviolet light. Furthermore, the surface coating makes it possible to adjust the dispersibility of the fluorescent materials, and the fluorescent layer can be easily designed.

Figure 6:
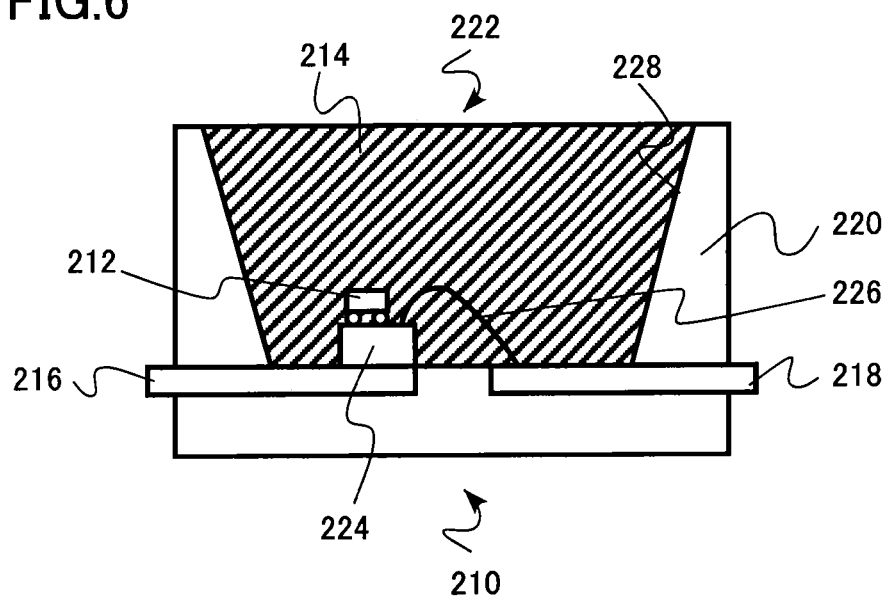
FIG. 6 is a cross-sectional view illustrating another example of the white light emitting device according to the embodiment.

FIG. 6 is a cross-sectional view illustrating another example of the white light emitting device according to the embodiment.

The white light emitting device shown includes a resin stem 210, a semiconductor light emitting element 212 mounted thereon, and a fluorescent layer 214 covering the semiconductor light emitting element 212. The sealing resin stem 210 has leads 216 and 218 formed from lead frames, and a resin portion 220 formed integrally with the leads.

The leads 216 and 218 are arranged so that one of the leads has one end closely opposed to one end of the other lead. The other ends of the leads 216 and 218 extend in opposite directions to each other, which are derived from the resin portion 220 to the outside.

The resin portion 220 is provided with an opening 222, and on the bottom of the opening, a protective zener diode 224 is mounted with an adhesive. A semiconductor light emitting element 212 is mounted on the protective zener diode 224. More specifically, the diode 224 is mounted on the lead 216. A wire 226 is connected from the diode 224 to the lead 218.

The semiconductor light emitting element 212 is surrounded by the inner wall surface of the resin portion 220, and this inner wall surface is inclined with respect to the direction of light extraction to act as a reflecting surface 228 for reflecting light. The fluorescent layer 214 filling the opening 222 contains the red fluorescent material and green-yellow fluorescent material according to the embodiment.

The semiconductor light emitting element 212 is stacked on the protective zener diode 224.

Figure 7:
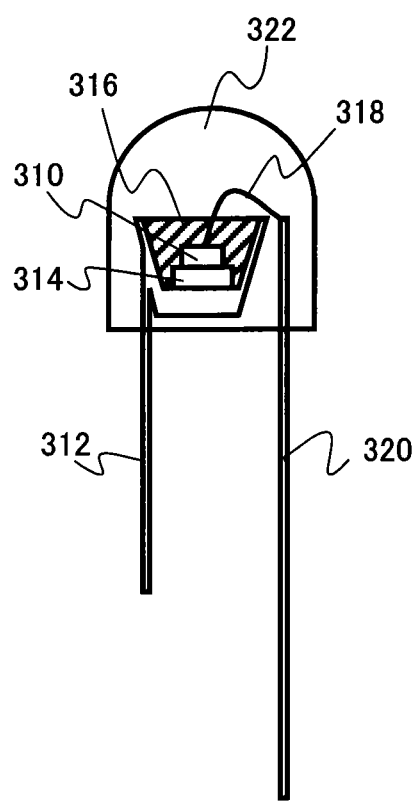
FIG. 7 is a cross-sectional view illustrating yet another example of the white light emitting device according to the embodiment.

FIG. 7 is a cross-sectional view illustrating yet another example of the white light emitting device according to the embodiment.

The white light emitting device shown is a shell-type lighting device. A semiconductor light emitting element 310 is mounted on a lead 312 with a mounting material 314 interposed therebetween, and covered with a fluorescent layer 316. A wire 318 connects a lead 320 to the semiconductor light emitting element 310, which is sealed with a casting material 322. The fluorescent layer 316 contains therein the red fluorescent material and green-yellow fluorescent material according to the embodiment.

Example

An example will be described below.

Prepared was a white light emitting device configured as shown in FIG. 5. The red fluorescent material and green-yellow fluorescent material of sample 1 calculated in the simulation in the embodiment were applied to the fluorescent layer. The obtained result is plotted as a star in FIG. 2. As in the case of the simulation, it can be confirmed that a white light emitting device is achieved which achieves a balance between high color rendering properties and a high luminescent efficiency.

While certain embodiments have been described, these embodiments have been presented by way of example only, and are not intended to limit the scope of the inventions. Indeed, the white light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A white light emitting device, comprising:
a light emitting element having a peak wavelength in a wavelength range of 430 nm or more and 460 nm or less; and
a fluorescent layer formed above the light emitting element and contains a red fluorescent material and a green-yellow fluorescent material,
wherein when a peak wavelength of a fluorescent material, a full width at half maximum of light emitted from a fluorescent material, an effective wavelength width of a spectrum for light emitted from a fluorescent material, and an external quantum efficiency of a fluorescent material are respectively denoted by $\lambda p$, FWHM, EWW, and $\eta$,
the red fluorescent material has the characteristics of:

625 nm≤$\lambda p$≤635 nm; 15 nm≤EWW≤45 nm; and 40%≤$\eta$≤75%, the green-yellow fluorescent material has the characteristics of:

545 nm≤$\lambda p$≤565 nm; 95 nm≤FWHM≤110 nm; and 75%≤$\eta$≤90%, the red fluorescent material has a composition of formula (1):

$$A_a(M_{1-s},Mn_s)F_b \qquad (1)$$

wherein, in formula (1), A is at least one element selected from K (potassium) and Cs (cesium), M is at least one element selected from Si (silicon) and titanium (Ti), and a, b, and s are numerical values which respectively satisfy 1.7≤a≤2.1, 5.3≤b≤6.3, and 0<s≤0.05, the green-yellow fluorescent material has a composition of formula (2) or (3):

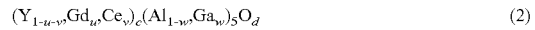

$$(Y_{1-u-v},Gd_u,Ce_v)_c(Al_{1-w},Ga_w)_5O_d \qquad (2)$$

wherein, in formula (2), c, d, u, v, and w represent numerical values which respectively satisfy 2.8≤c≤3.2, 11.5≤d≤12.5, 0≤u≤0.2, 0.02≤v≤0.15, and 0≤w≤0.3,

$$(Ba_x,Sr_{1-z},Ca_y,Eu_z)_e SiO_f \qquad (3)$$

wherein, in formula (3), e, f, x, y, and z represent numerical values which respectively satisfy 1.9≤e≤2.1, 3.6≤f≤4.1, 0.15≤x≤0.4, 0≤y≤0.1, and 0<z≤0.15, and wherein the white light emitting device has an Ra value from 86 to 90 and a white efficiency from 196 to 218 lm/excitation light W.

2. The device according to claim 1, wherein the red fluorescent material has an internal quantum efficiency $\eta'$ of 60% or more.

3. The device according to claim 1, wherein the green-yellow fluorescent material has an internal quantum efficiency $\eta'$ of 85% or more.

4. The device according to claim 1, wherein the fluorescent layer is formed by dispersing the red fluorescent material and the green-yellow fluorescent material in a resin.

5. The device according to claim 4, wherein the red fluorescent material and the green-yellow fluorescent material are dispersed at a ratio of 5 wt % or more and 50 wt % or less in the resin.

6. The device according to claim 1, wherein a surface coating process is applied to the red fluorescent material and the green-yellow fluorescent material.

7. The device according to claim 1, wherein a color temperature of the white light emitting device is a bulb color.

8. The device of claim 1, wherein the green-yellow fluorescent material has a composition of formula (2).

9. The device of claim 1, wherein the green-yellow fluorescent material has a composition of formula (3).

* * * * *